United States Patent
Cao

(10) Patent No.: US 12,074,574 B2
(45) Date of Patent: Aug. 27, 2024

(54) OUTPUT MATCHING CIRCUIT AND POWER AMPLIFIER COMPRISED THEREOF

(71) Applicant: Xiumei Cao, Guangdong (CN)

(72) Inventor: Xiumei Cao, Guangdong (CN)

( * ) Notice: Subject to any disclaimer, the term of this patent is extended or adjusted under 35 U.S.C. 154(b) by 547 days.

(21) Appl. No.: 17/425,319

(22) PCT Filed: Mar. 28, 2019

(86) PCT No.: PCT/CN2019/080126
§ 371 (c)(1),
(2) Date: Jul. 22, 2021

(87) PCT Pub. No.: WO2020/151082
PCT Pub. Date: Jul. 30, 2020

(65) Prior Publication Data
US 2022/0085776 A1 Mar. 17, 2022

(30) Foreign Application Priority Data

Jan. 23, 2019 (CN) .......................... 201910060857.5

(51) Int. Cl.
*H03F 3/21* (2006.01)
*H03F 1/56* (2006.01)
(Continued)

(52) U.S. Cl.
CPC ............. *H03F 3/245* (2013.01); *H03F 1/565* (2013.01); *H03F 3/72* (2013.01); *H03F 2200/318* (2013.01); *H03F 2203/7209* (2013.01)

(58) Field of Classification Search
CPC . H03F 3/245; H03F 1/565; H03F 3/72; H03F 2200/318; H03F 2203/7209;
(Continued)

(56) References Cited

U.S. PATENT DOCUMENTS 8,674,764 B2 *  3/2014  Kondo ..................... H03F 3/245
                                                              330/252
2011/0241781 A1 * 10/2011 Owen ....................... H03F 3/265
                                                              330/277
(Continued)

FOREIGN PATENT DOCUMENTS

CN         101627530 A      1/2010
CN         102882479 A      1/2013
(Continued)

OTHER PUBLICATIONS

International Search Report of PCT Patent Application No. PCT/CN2019/080126 issued on Oct. 22, 2019.

*Primary Examiner* — Andrea Lindgren Baltzell
*Assistant Examiner* — Khiem D Nguyen

(57) ABSTRACT

Provided are an output matching circuit and a power amplifier comprised thereof. The output matching circuit comprises an impedance transformation component and a first matching component connected to the input end of the impedance transformation component to establish matching. The first matching circuit comprises an impedance element and a controllable switch element whose on/off is controlled by an external control signal to form different impedances. The output matching circuit realizes the reconstruction of the output stage matching circuit and the switching of the output operating frequency band. It can be used for high frequency/medium frequency/low frequency, which reduces the cost, the number of components, and the design difficulty, and is easy to be integrated. It can be used for multi-band multiplexing power amplifiers. The wide-band amplifier is realized, the number of components and material cost are reduced, and the system integration degree of the power amplifier is increased.

10 Claims, 19 Drawing Sheets

(51) Int. Cl.
*H03F 3/24* (2006.01)
*H03F 3/72* (2006.01)

(58) Field of Classification Search
CPC ............... H03F 2200/111; H03F 3/19; H03H 2007/386; H03H 7/38
USPC .................................................. 330/51, 295
See application file for complete search history.

(56) References Cited

U.S. PATENT DOCUMENTS

2014/0112213 A1* 4/2014 Norholm ................ H04B 1/56
370/277
2017/0279419 A1 9/2017 Goel et al.

FOREIGN PATENT DOCUMENTS

| CN | 106059502 A | 10/2016 |
| CN | 106656069 A | 5/2017 |
| CN | 107453719 A | 12/2017 |

* cited by examiner

OUTPUT MATCHING CIRCUIT AND POWER AMPLIFIER COMPRISED THEREOF

TECHNICAL FIELD

The invention relates to an output matching circuit and a power amplifier comprised thereof.

BACKGROUND

For diverse businesses provided by radio communication, radio equipment is required to work in multiple frequency bands. For example, for the cellular data RF front-end of mobile phone, its power amplifier system is expected to support high frequency band, medium frequency band and low frequency band at present, and more frequency bands need to be supported as the technology evolves. The current solution is to prepare different groups of power amplifiers and output matching circuits for high frequency, medium frequency and low frequency, which leads to high cost, large number of components, difficult integration and difficult design. Especially, in order to ensure the power and bandwidth of the signal transmitted to a 50-ohm antenna, the broadband characteristics of the output matching circuit are extremely important.

SUMMARY

The purpose of the present invention is to provide a broadband reconfigurable output stage matching circuit capable of switching operating frequency bands.

To achieve the purpose of the present invention, the output matching circuit provided herein includes:
  an impedance transformation component, configured to transform impedance;
  a first matching component, connected to an input end of the impedance transformation component to establish matching; the first matching component comprises an impedance element and a controllable switch element whose on/off is controlled by an external control signal to form different impedances.

Furthermore, the output matching circuit provided by the present invention includes a second matching circuit connected to the power input end of the impedance transformation component to establish matching to form different impedances.

Furthermore, the output matching circuit provided by the present invention includes a third matching circuit connected to an output end of the impedance transformation component to establish matching to form different impedances.

Furthermore, the output matching circuit provided by the present invention includes a selection component for frequency band subdivision connected to an output end of the impedance transformation component; and the selection component for frequency band subdivision includes at least two independent controllable switch elements whose on/off is controlled by an external signal, and each controllable switch element constitutes one output.

Furthermore, the output matching circuit provided by the present invention includes a selection component for frequency band subdivision connected to an output end of the third matching component; and the selection component for frequency band subdivision includes at least two independent controllable switch elements whose on/off is controlled by an external signal, and each controllable switch element constitutes one output.

Another object of the present invention is to provide a power amplifier which is capable of realizing the switching of operating frequency, supporting the signal amplification in a wider frequency band, and solving the problems of large number of components, difficulty in integration and difficulty in design caused by setting multiple groups of power amplifiers for power amplification in different frequency bands in the prior art. The power amplifier includes an input circuit and an output matching circuit provided by the present invention.

Furthermore, the input circuit includes at least two preamplifier circuits, a matching circuit for matching an output signal of each preamplifier circuit, an input transformer T1 comprising at least two output taps, an output stage amplifier circuit with the same number as the output taps of the input transformer T1, a switch S1 and a switch S2; and circuit power supply VCC1 is loaded on an input end of the input transformer T1 via the switch S1 and the switch S2 respectively; operating frequencies of the matching circuit are different.

Furthermore, the matching circuit is composed of a capacitive element, or a capacitive element and an inductive element.

Furthermore, the input circuit comprises an input matching circuit for performing input matching on a signal loaded on an input end of each preamplifier circuit.

Furthermore, one or more of the input circuit and the output matching circuit or other functional components are integrated on one chip, and the others are integrated on another chip or distributed independently.

The beneficial effects of the invention include:
  1. The output matching circuit provided by the invention controls the on/off of the controllable switch elements of the first matching circuit, second matching circuit and third matching circuit via a control signal, thereby realizing the reconstruction of the output stage matching circuit and the switching of the output operating frequency band. The output matching circuit can be used for high frequency/medium frequency/low frequency, which reduces the cost, the number of components, and the design difficulty, and is easy to be integrated. The output matching circuit can be used for multi-band multiplexing power amplifiers. The wide-band amplifier is realized, the number of components and material cost are reduced, and the system integration degree of the power amplifier is increased.
  2. The output matching circuit provided by the invention is matched with the selection component for frequency band subdivision, so that one or more outputs are realized, and the output controllability of the output matching circuit provided by the invention is further improved.
  3. The power amplifier of the invention utilizes the output matching circuit provide by the invention to realize a reconfigurable output stage matching circuit, thereby realizing the switching of operating frequency in one single amplifier, supporting the signal amplification in a wider frequency band, and solving the problems of large number of components, difficulty in integration and difficulty in design caused by setting multiple groups of power amplifiers for power amplification in different frequency bands in the prior art.
  4. One or more of the input circuit and the output matching circuit or other functional components are integrated on one chip, and the others are integrated on another chip or distributed independently, which is easy to realize.

In the figures: 1—impedance transformation component, 2—first matching component, 3—second matching component, 4—third matching component, 5—selection component for frequency band subdivision, 6—preamplifier circuit, 7—matching circuit, 8—output stage amplifier circuit, 9—bias circuit, 10—input matching circuit.

DETAILED DESCRIPTION OF THE INVENTION

In order to make the to-be-solved technical problems, technical solutions and beneficial effects of the invention clearer, the invention will be described in further detail below with reference to the drawings and embodiments. It should be understood that the specific embodiments described herein are only for the purpose of illustrating the invention and are not intended to limit this application.

Figure 1:
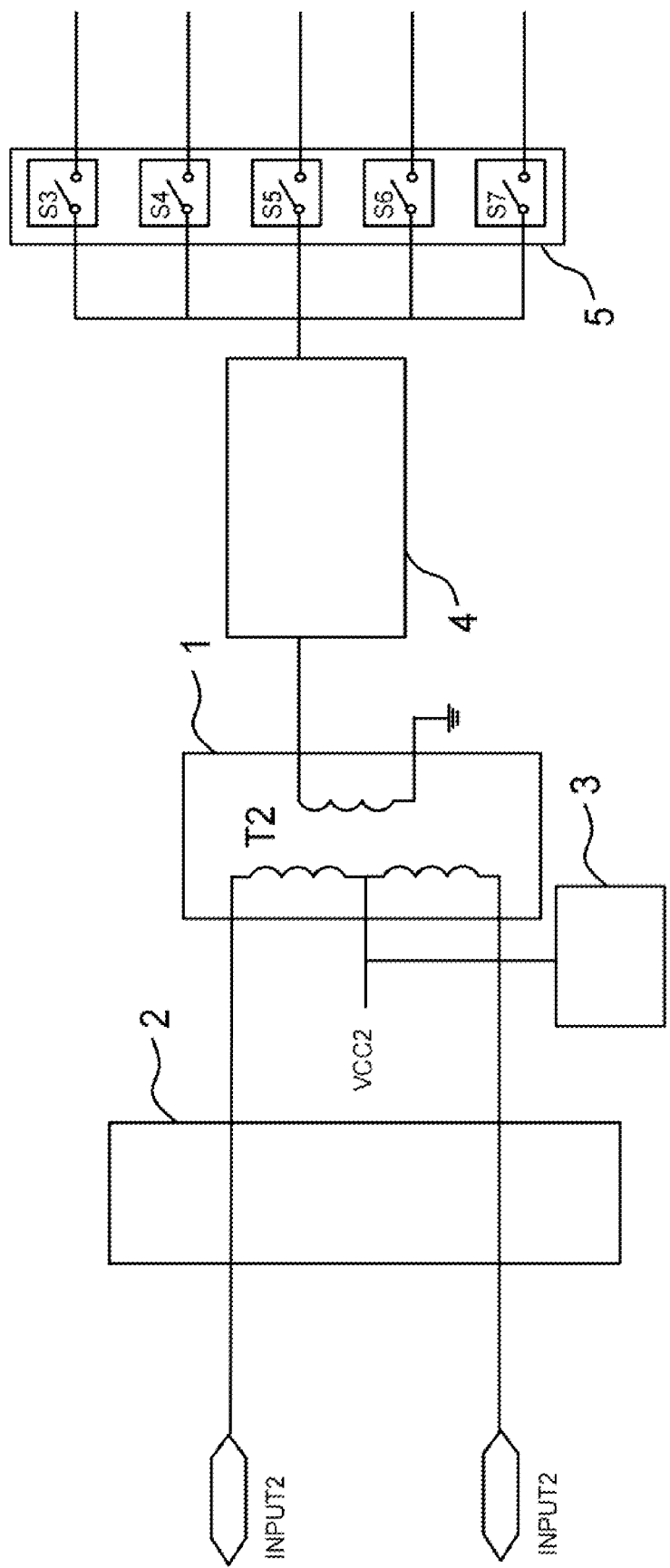
FIG. 1 is a structural diagram of the output matching circuit provided by the present invention.

FIG. 1 illustrates the output matching circuit of the present invention, which includes:

an impedance transformation component 1, configured to transform impedance;

a first matching component 2, connected to an input end of the impedance transformation component to establish matching and form different impedances, so that low frequency/medium frequency/high frequency can pass through.

Figure 2:
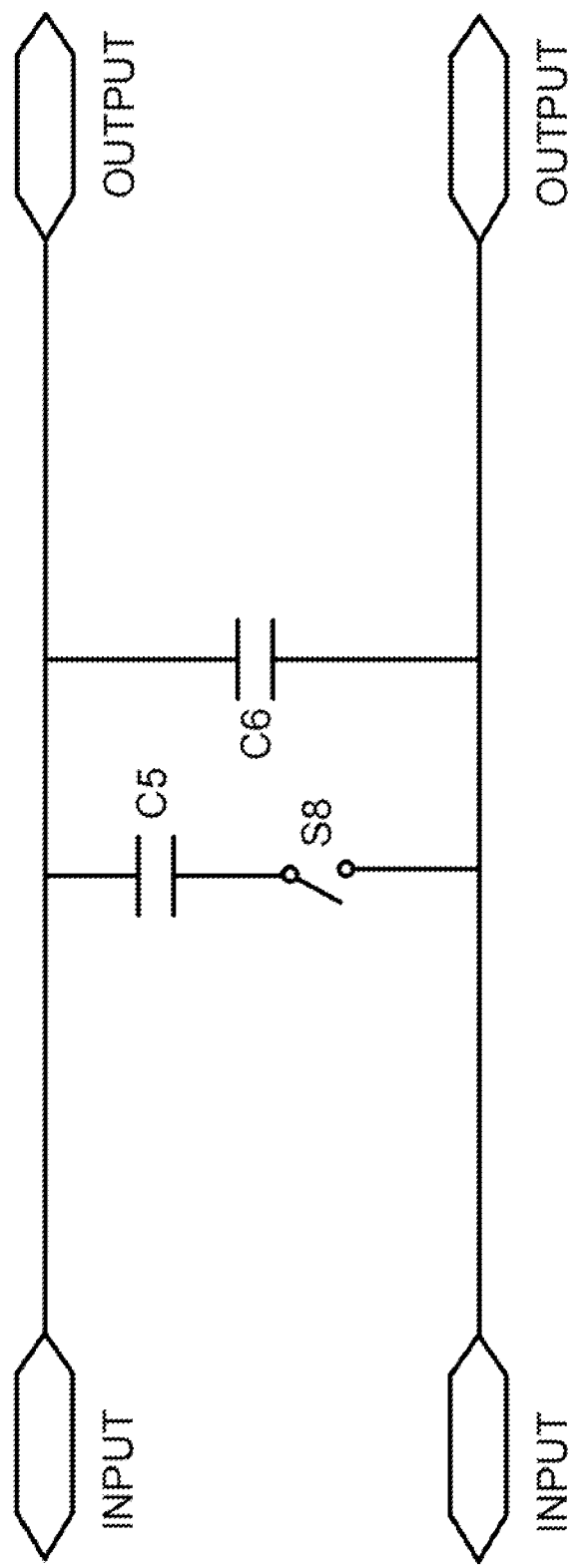
FIG. 2 is an example of the first matching component described in the present invention.

The first matching component 2 may be anyone of the existing matching circuits, including an impedance element and a controllable switch element whose on/off is controlled by an external control signal, and the specific structure may be one of the followings:

1. As shown in FIG. 2, first matching component 2 includes a capacitor C5, a capacitor C6, and a controllable switch S8. Capacitor C5 and controllable switch S8 are connected in series between two signal input ends of the impedance transformation component, and capacitor C6 is connected in parallel to the two ends of capacitor C5 and controllable switch S8 connected in series.

Figure 3:
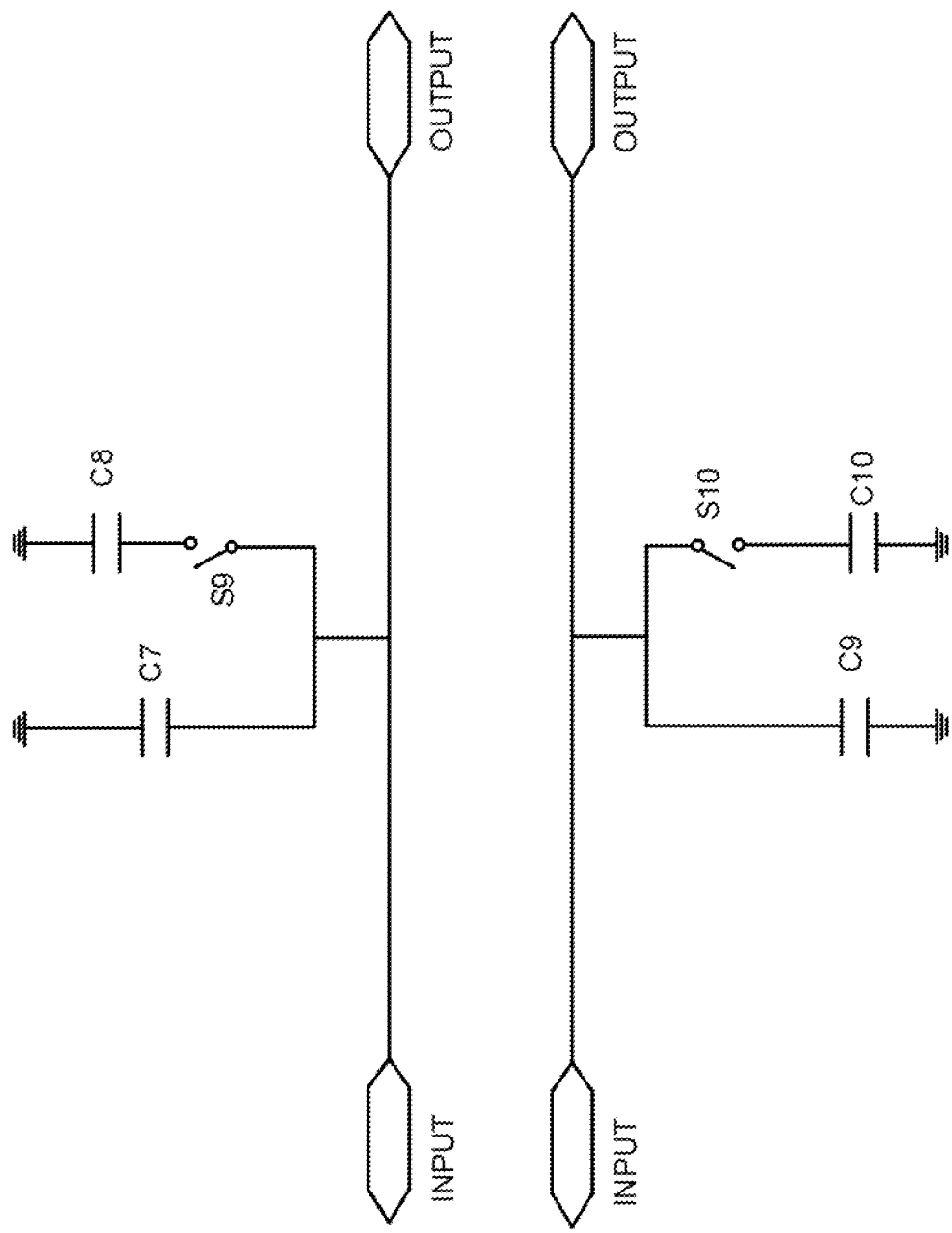
FIG. 3 is an another example of the first matching component described in the present invention.

2. As shown in FIG. 3, first matching component 2 includes a capacitor C7, a capacitor C8, a capacitor C9, a capacitor C10, a controllable switch S9 and a controllable switch S10. Capacitor C8 and controllable switch S9 are connected in series between a signal input end of impedance transformation component 1 and ground, and this signal input end is further grounded via capacitor C7. Capacitor C10 and controllable switch S10 are connected in series between the other signal input end of impedance transformation component 1 and ground, and this signal input end is further grounded via capacitor C9.

Figure 4:
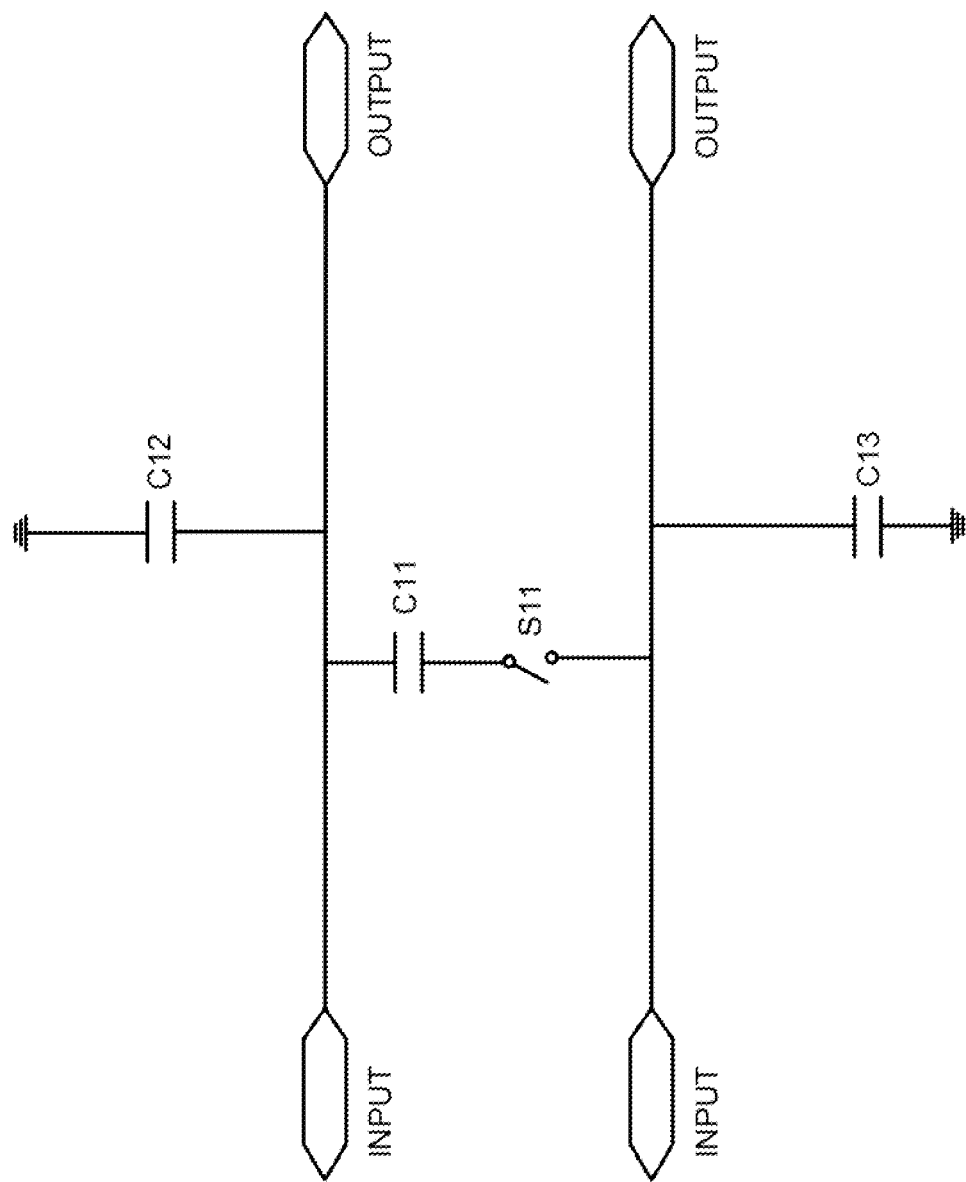
FIG. 4 is an another example of the first matching component described in the present invention.

3. As shown in FIG. 4, first matching component 2 includes a capacitor C11, a capacitor C12, a capacitor C13, and a controllable switch S11. Capacitor C11 and controllable switch S11 are connected in series between two signal input ends of impedance transformation component 1. Capacitor C12 is connected in series between one signal input end of impedance transformation component 1 and ground. Capacitor C13 is connected in series between the other signal input end of impedance transformation component 1 and ground.

Figure 5:
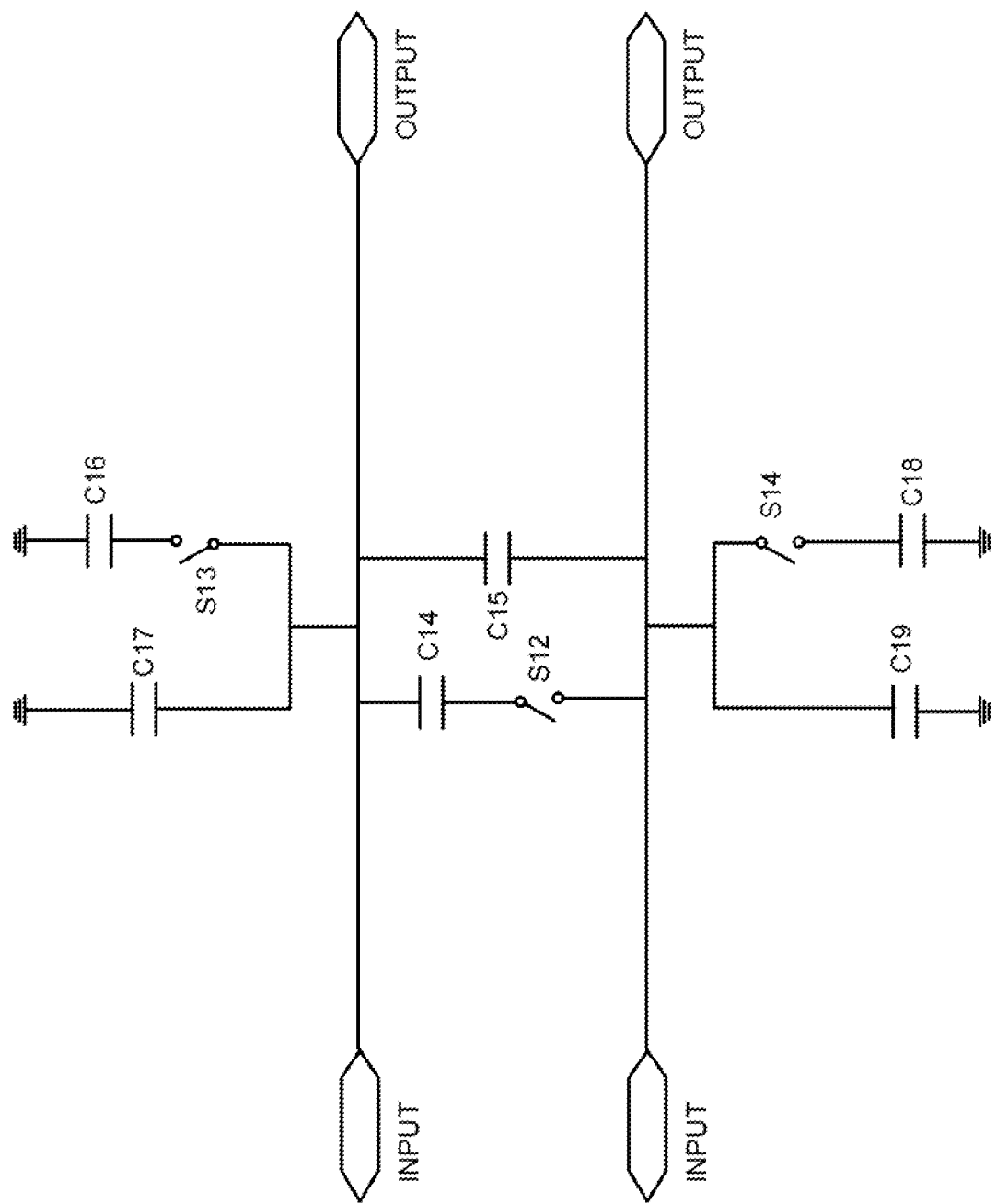
FIG. 5 is an another example of the first matching component described in the present invention.

4. As shown in FIG. 5, first matching component 2 includes capacitors C14, C15, C16, C17, C18 and C19, and controllable switches S12, S13 and S14. Capacitor C14 and controllable switch S12 are connected in series between two signal input ends of impedance transformation component 1. Capacitor C15 is connected in parallel to two ends of capacitor C14 and controllable switch S12 connected in series. Capacitor C16 and controllable switch S13 are connected in series between one signal input end of impedance transformation component 1 and ground, and this signal input end is further grounded via capacitor C17. Capacitor C18 and controllable switch S14 are connected in series between the other signal input end of impedance transformation component 1 and ground, and this signal input end is further grounded via capacitor C19.

Figure 6:
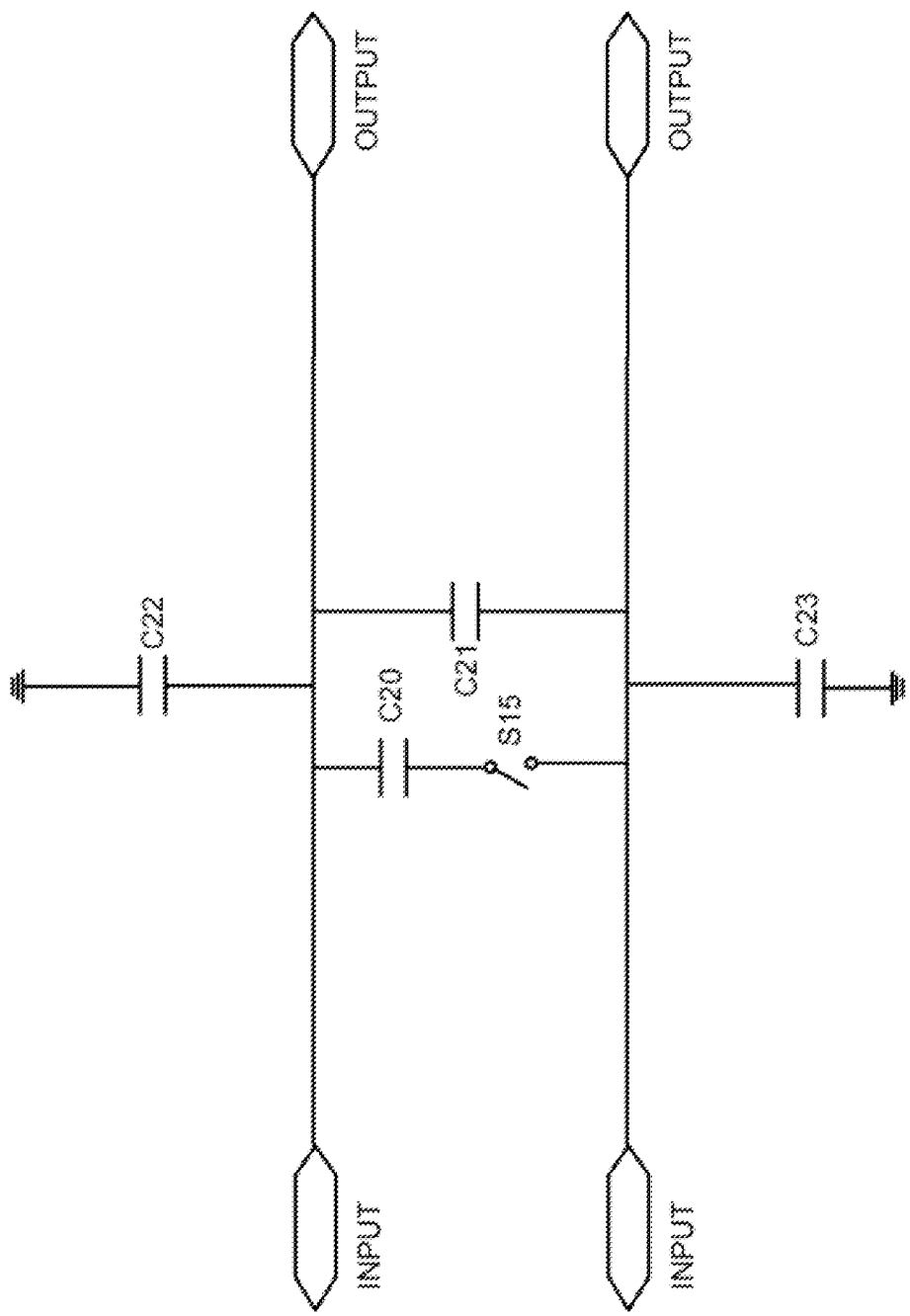
FIG. 6 is an another example of the first matching component described in the present invention.

5. As shown in FIG. 6, first matching component 2 includes capacitive elements C20, C21, C22, C23, and a switch element of controllable switch S15. Capacitor C20 and controllable switch S15 are connected in series between two signal input ends of impedance transformation circuit 1. Capacitor C21 is connected in parallel to two ends of capacitor C20 and controllable switch S15 connected in series. Capacitor C22 is connected between one signal input end of impedance transformation component 1 and ground. Capacitor C23 is connected between the other signal input end of impedance transformation component 1 and ground.

Figure 7:
FIG. 7 is an example of the second matching component described in the present invention.

In some embodiments, the output matching circuit provided by the present invention further includes a second matching circuit 3 connected to the power input end of impedance transformation component 1 to establish matching, and second matching component 3 is composed of an impedance element, or an impedance element and a controllable switch element whose on/off is controlled by an external control signal, the specific structure may be one of the followings:

1. As shown in FIG. 7, second matching component 3 includes a capacitor C24, which is connected between the power input end of impedance transformation component 1 and ground.

Figure 8:
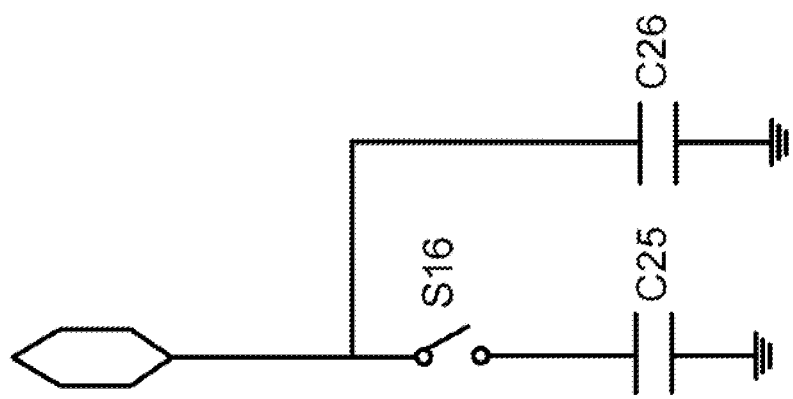
FIG. 8 is an another example of the second matching component described in the present invention.

2. As shown in FIG. 8, second matching component 3 includes a capacitor C25, a capacitor C26 and a controllable switch S16. Capacitor C25 and controllable switch S16 are connected in series between the power input of impedance transformation component 1 and ground. Capacitor C26 is independently connected between the power input end of impedance transformation component 1 and ground.

Figure 9:
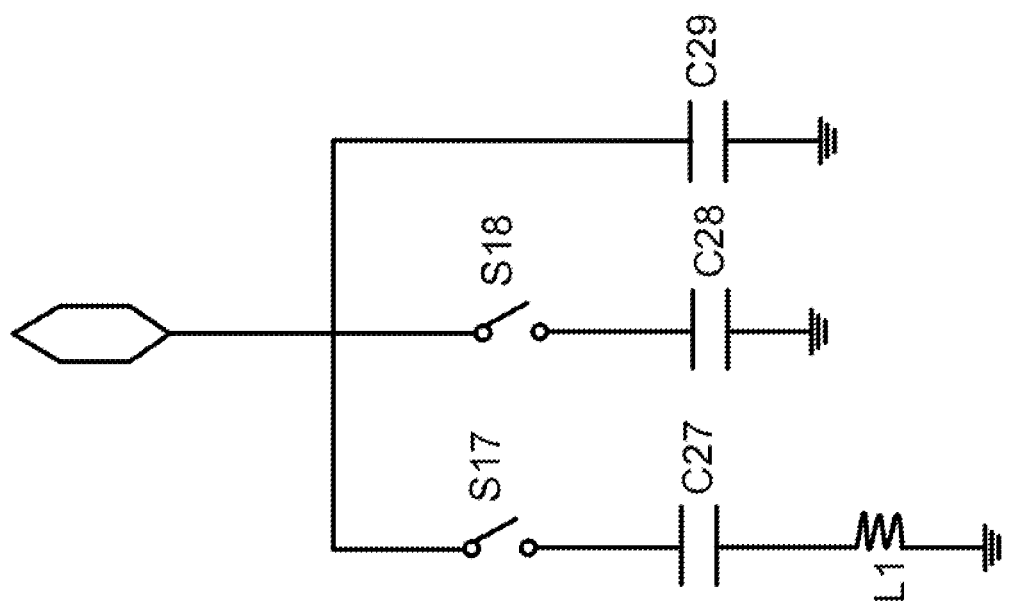
FIG. 9 is an another example of the second matching component described in the present invention.

3. As shown in FIG. 9, second matching component 3 includes a capacitor C27, a capacitor C28, a capacitor C29, a controllable switch S17 and a controllable switch S18. Capacitor C27 and controllable switch S17, as well as capacitor C28 and controllable switch S18 are respectively connected in series between the power input end of impedance transformation component 1 and ground. Capacitor C29 is connected between the power input end of impedance transformation component 1 and ground. When this structure is adopted, an inductive element L1 needs to be connected in series on the branch where capacitor C27 and controllable switch S17 are connected in series.

Figure 10:
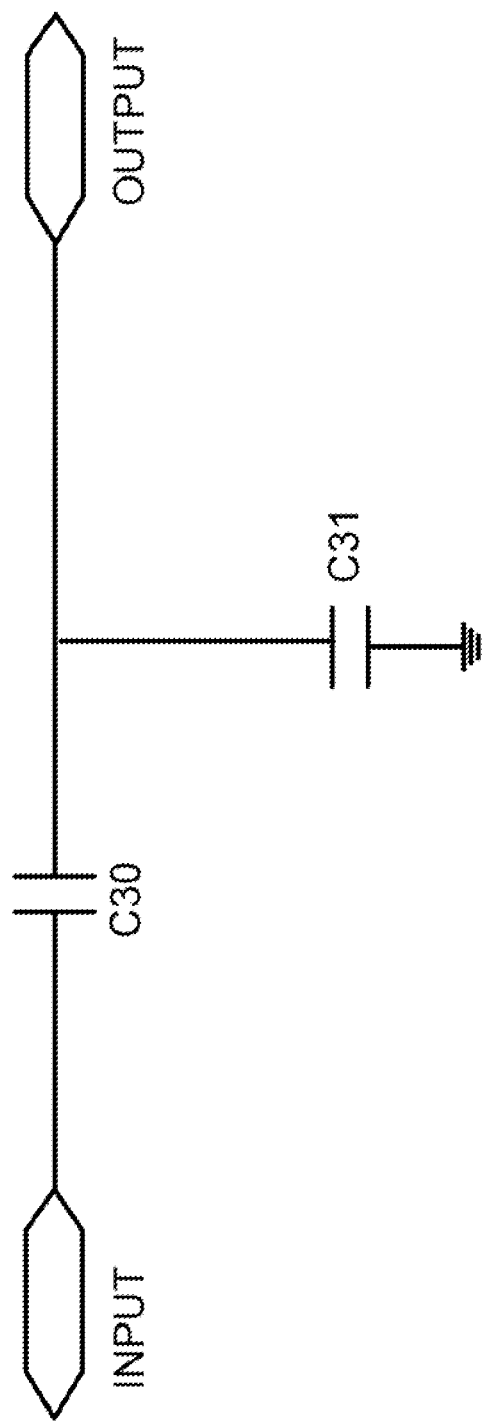
FIG. 10 is an example of the third matching component described in the present invention.

In some embodiments, the output matching circuit provided by the present invention further includes a third matching circuit 4 connected to the output end of impedance transformation component 1 to establish matching. The third matching component may be any of the existing matching circuits composed of an impedance element, or an impedance element and a controllable switch element whose on/off is controlled by an external control signal, the structure may be one of the followings:

1. As shown in FIG. 10, third matching component 4 includes a capacitor C30 and a capacitor C31. Capacitor C30 is connected to the signal output end of impedance transformation component 1. Capacitor C31 is connected between the signal output end of impedance transformation component 1 and ground.

Figure 11:
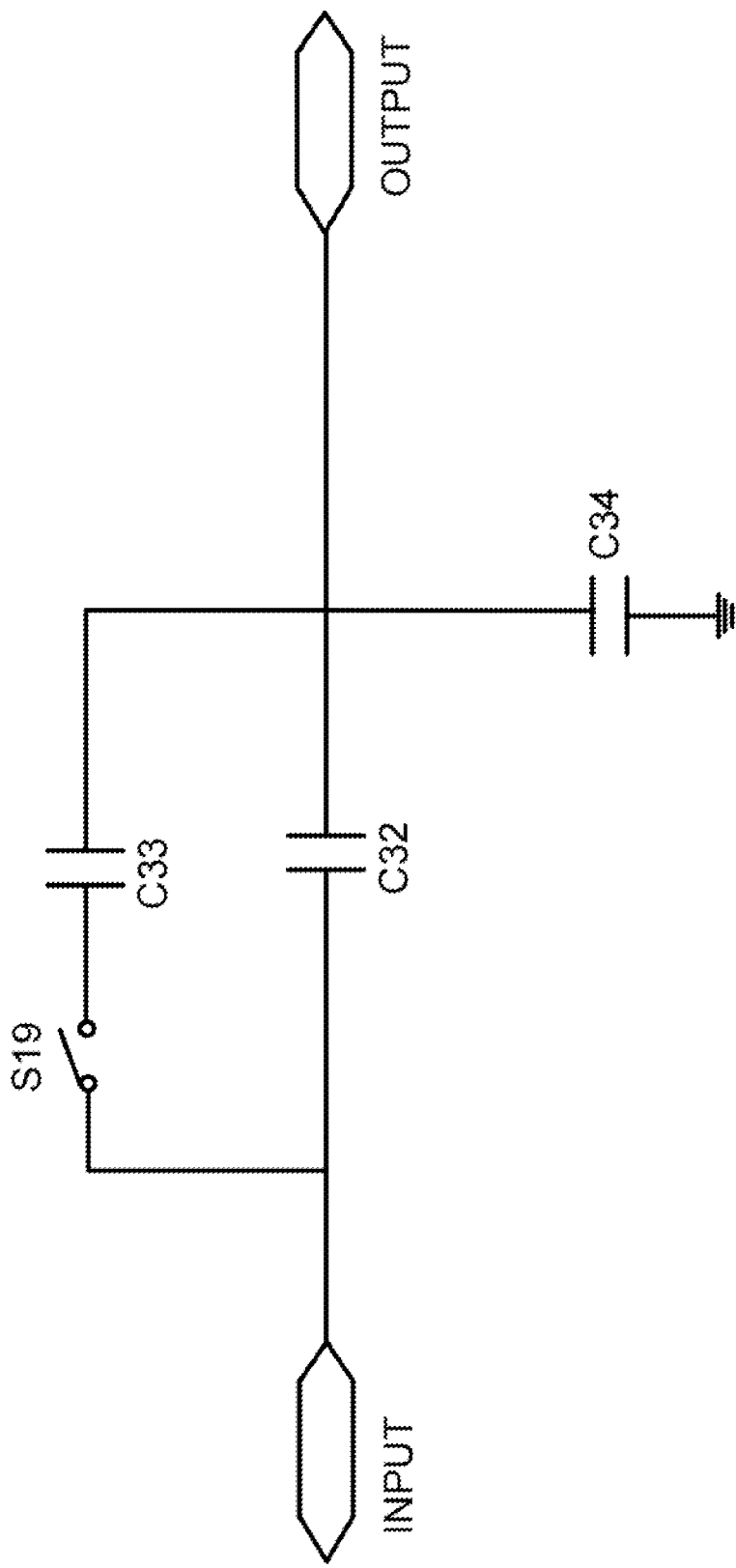
FIG. 11 is an another example of the third matching component described in the present invention.

2. As shown in FIG. 11, third matching component 4 includes a capacitor C32, a capacitor C33, a capacitor C34, and a controllable switch S19. Capacitor C32 is connected to the signal output end of impedance transformation component 1. Capacitor C33 and controllable switch S19 are connected in series and they are in parallel with two ends of capacitor C32. Capacitor C34 is connected between the signal output end of impedance transformation component 1 and ground.

Figure 12:
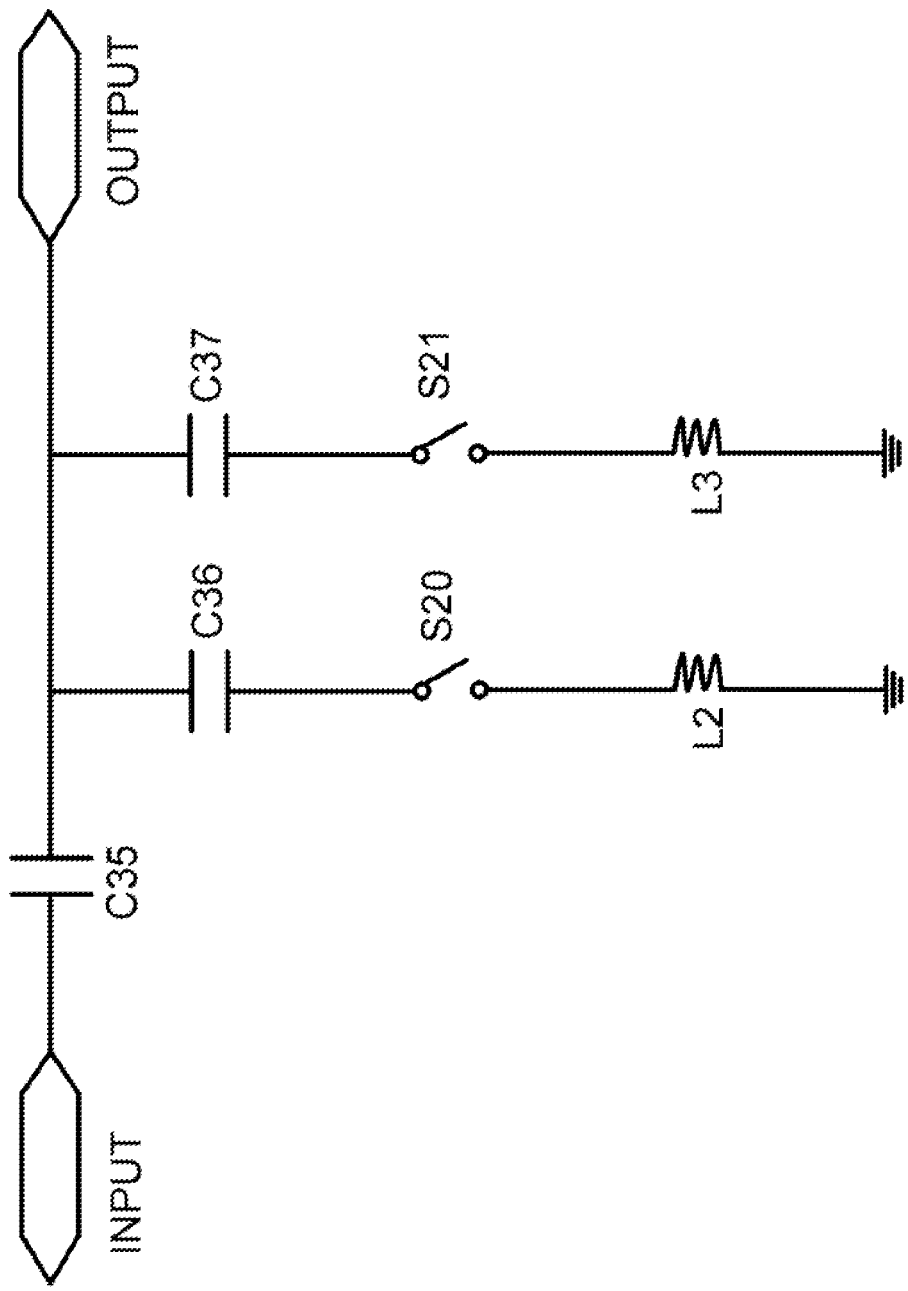
FIG. 12 is an another example of the third matching component described in the present invention.

3. As shown in FIG. 12, third matching component 4 includes a capacitor C35, a capacitor C36, a capacitor C37, a controllable switch S20 and a controllable switch S21. Capacitor C35 is connected to the signal output end of impedance transformation component 1. Capacitor C36 and controllable switch S20, as well as capacitor C37 and controllable switch S21 are respectively connected in series between the signal output end of impedance transformation component 1 and ground. When this structure is adopted, inductive elements L2 and L3 need to be connected in series on the branch where capacitor C36 and controllable switch S20 are connected in series, and on the branch where capacitor C37 and controllable switch S21 are connected in series, respectively.

Figure 13:
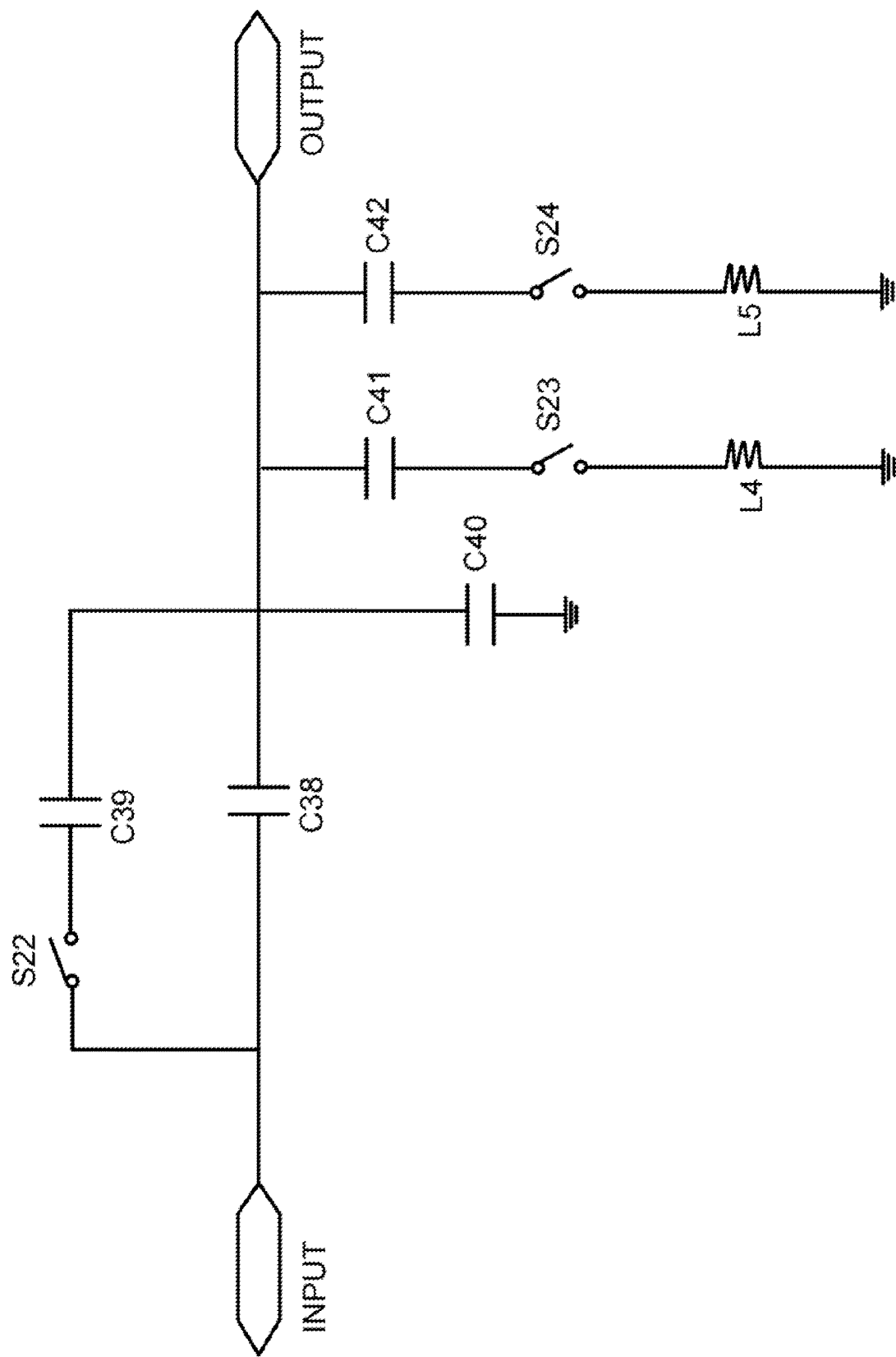
FIG. 13 is an another example of the third matching component described in the present invention.

4. As shown in FIG. 13, third matching component 4 includes a capacitor C38, a capacitor C39, a capacitor C40, a capacitor C41, a capacitor C42, and controllable switches S22, S23 and S24. Capacitor C38 is connected to the signal output end of impedance transformation component 1. Capacitor C39 and controllable switch S22 are connected in series and they are in parallel with two ends of capacitor C38. Capacitor C40 is connected between the signal output end of impedance transformation component 1 and ground. Capacitor C41 and controllable switch S23, as well as capacitor C42 and controllable switch S24 are connected in series respectively between the signal output end of impedance transformation component 1 and ground. When this structure is adopted, inductive elements L4 and L5 need to be connected in series on the branch where capacitor C41 and controllable switch S23 are connected in series, and on the branch where capacitor C24 and controllable switch S24 are connected in series, respectively.

For the circuit structures of first matching component 2, second matching circuit 3 and third matching circuit 4 described in the present invention, an impedance element of capacitor is taken as an example. In actual use, impedance elements such as inductors and resistors can be used instead of capacitors to constitute matching circuits.

In some embodiments, the output matching circuit provided by the present invention further includes a selection component for frequency band subdivision 5 as an output path. When the output matching circuit provided by the present invention does not include third matching circuit 4, selection component for frequency band subdivision 5 is connected to the output end of impedance transformation component 1. When the output matching circuit provided by the present invention includes third matching circuit 4, selection component for frequency band subdivision 5 is connected to the output end of third matching circuit 4.

Selection component for frequency band subdivision 5 may adopt any of the existing circuit structures. The structure adopted by the present invention includes at least two independent switch elements, such as 2, 4, 5, 6, 8 or others. Each switch element constitutes an output. As shown in FIG. 1, it is composed of 5 independent controllable switches S3-S7, each controllable switch constitutes an output, and one or more controllable switches can be controlled according to the load connection to achieve the selection of output path.

In the present application, impedance transformation component 1 maybe any types of the existing transformer capable of realizing impedance transformation, which is used to connect the front-stage circuit and back-stage circuit. A balanced-unbalanced transformer (Balun) is used in the present application.

The controllable switch of the output matching circuit provided by the invention is a radio frequency switch, and is controlled to be turned on and off by an external signal, so that each matching circuit (first matching circuit, second matching circuit, third matching circuit) in the output matching circuit can be reconstructed to form different impedances, and the switching of the output operating frequency band can be realized.

Figure 14:
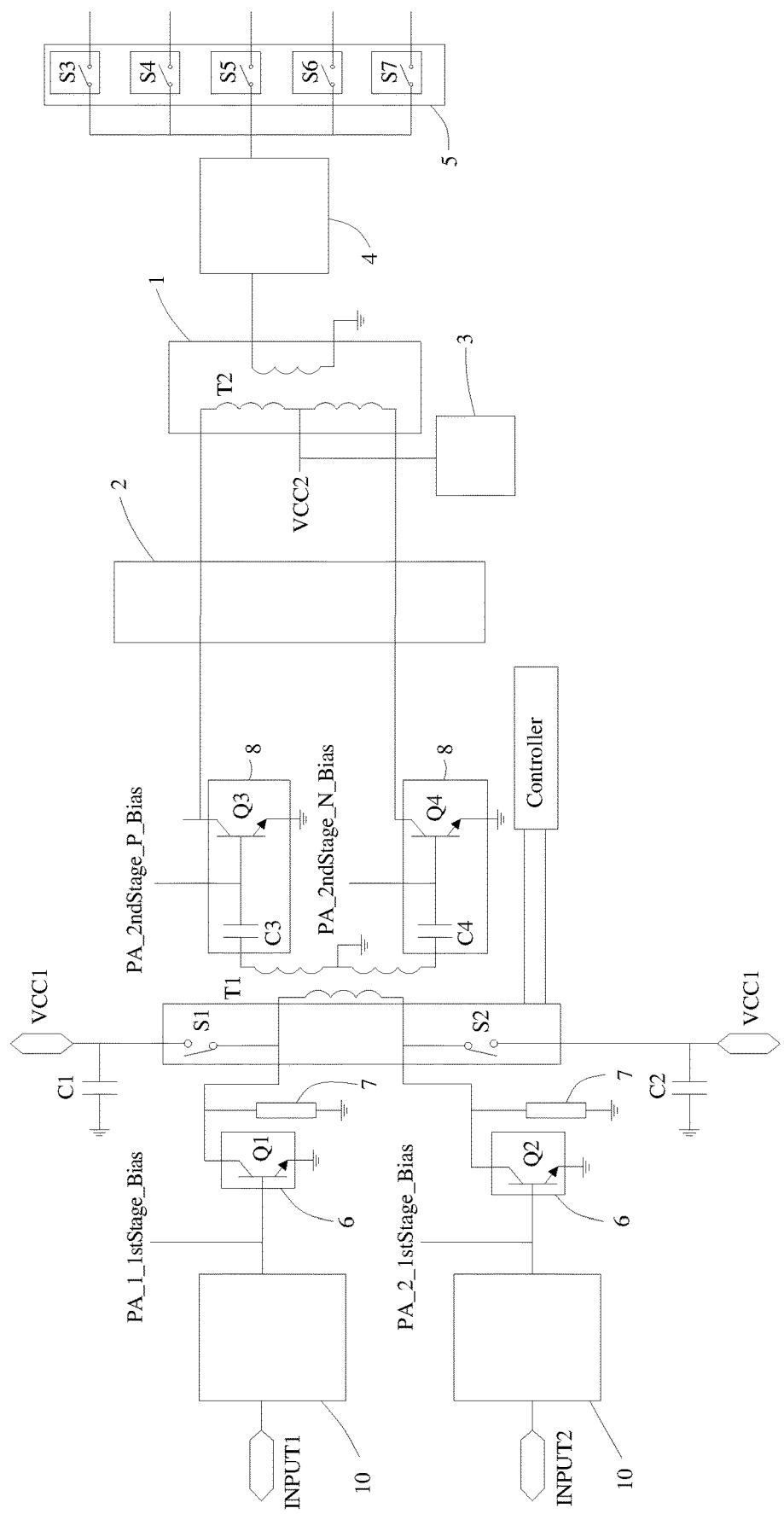
FIG. 14 is a structural schematic diagram of the power amplifier described in the present invention.

The output matching circuit provided by the present invention can be used in any circuits, and is applied to a power amplifier as a specific example. FIG. 14 illustrates a power amplifier formed by using the output matching circuit provided by the present invention, which includes an input circuit and an output matching circuit provided by the present invention. In the output matching circuit, impedance transformation component 1 may adopt any of the existing transformers as output transformer T2.

The input circuit includes at least two preamplifier circuits 6, a matching circuit 7 for matching an output signal of each preamplifier circuit, an input transformer T1 with at least two output taps, an output stage amplifier circuit 8 with the same number as the output taps of the input transformer T1, a switch S1 and a switch S2.

The output end of each output stage amplifier circuit 8 is connected to an input tap of output transformer T2. Matching circuit 7 is connected between an output end of preamplifier circuit 6 and ground, and performs power matching on the signal output by preamplifier circuit 6. Circuit power supply VCC1 is loaded on an input end of input transformer T1 via switch S1 and switch S2 respectively. The operating frequency of each matching circuit 7 is different. According to different signal frequencies received by preamplifier circuit 6, one preamplifier circuit and one output stage amplifier circuit are selectively turned on, and switch S1 or switch S2 is controlled to be turned on by an external control signal.

The described preamplifier circuit 6 may be any of the existing circuits or components capable of amplifying signals, the one adopted by the present invention is composed of triodes. For example, two preamplifier circuits, which are respectively composed of a power-amplifier tube Q1 and a power-amplifier tube Q2. The corresponding input transformer T1 includes two output taps, and each tap is connected with an output stage amplifier circuit 8.

The above-mentioned output stage amplifier circuit 8 may be any existing circuits or components capable of amplifying signals, and the one adopted by the present invention is composed of triodes and capacitors. An output stage amplifier circuit includes a capacitor C3 and a power-amplifier tube Q3. The first plate of capacitor C3 is connected with an output tap of input transformer T1, and the second plate is connected with the control end of power-amplifier tube Q3. The positive power supply end of power-amplifier tube Q3 is an output end connected to an input tap of output transformer T2, and the negative power supply end is grounded. The other output stage amplifier circuit includes capacitor C4 and power-amplifier tube Q4. The first plate of capacitor C4 is connected with the other output tap of input transformer T1, and the second plate is connected with the control end of power-amplifier tube Q4. The positive power supply end of power-amplifier tube Q4 is an output end connected to the other input tap of output transformer T2, and the negative power supply end is grounded.

Figure 18:
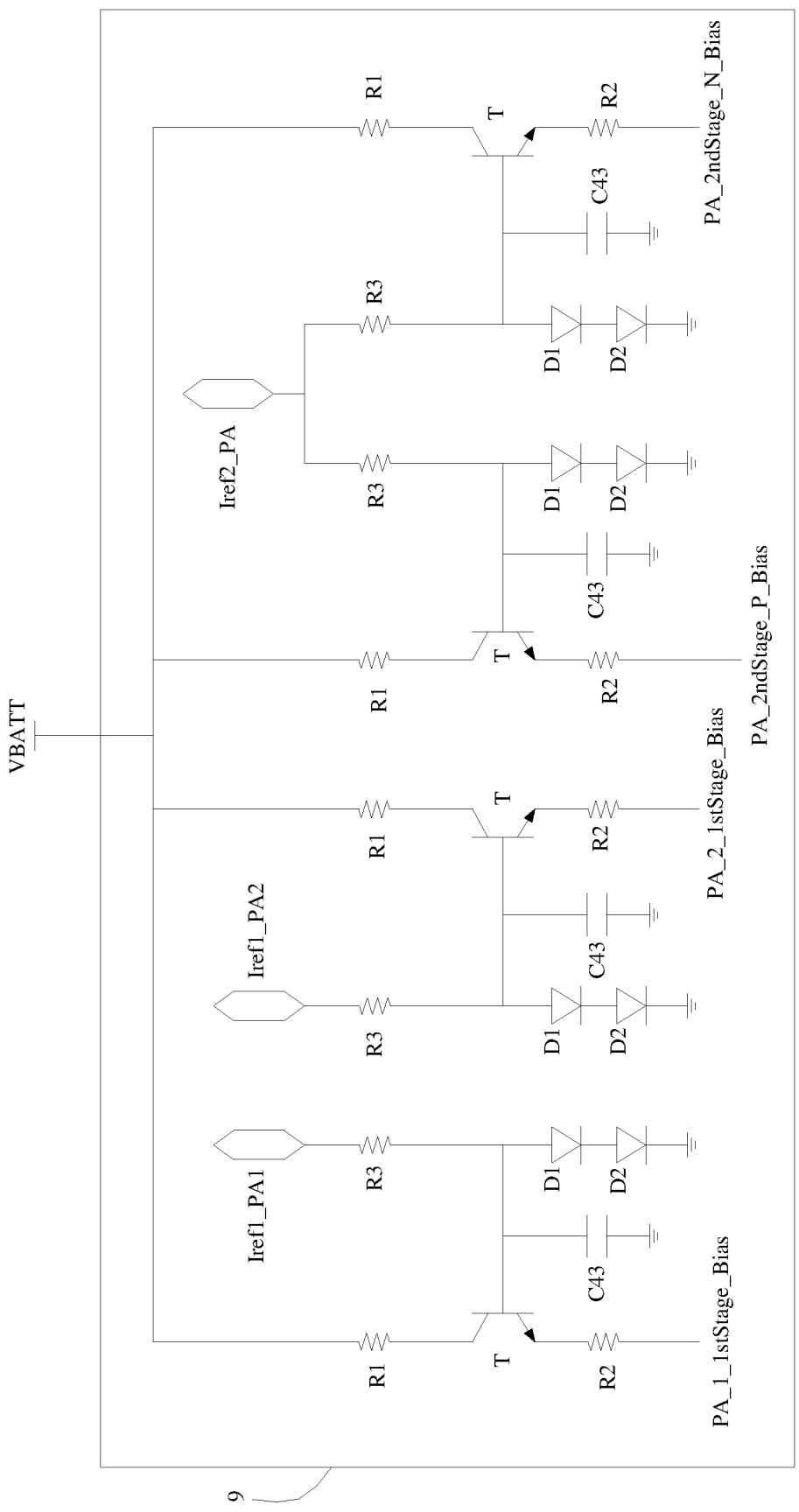
FIG. 18 is an example of the bias circuit described in the present invention.

The power-amplifier tubes Q1, Q2, Q3 and Q4 described in the present invention may be field effect transistors or triode transistors. Turn-on and turn-off of power-amplifier tubes Q1, Q2, Q3 and Q4 are controlled by control signals which can be generated by any circuits. In the present application, bias circuits are adopted to control turn-on and turn-off of power-amplifier tubes Q1, Q2, Q3 and Q4. The bias circuit may be any of the existing bias circuits. The schematic circuit diagram of the bias circuit 9 is shown in FIG. 18, which includes bias branches with the same number as the power-amplifier tubes. Each bias branch includes an output end, and the output control signal is loaded on the control ends of power-amplifier tubes Q1, Q2, Q3 and Q4. Each bias branch includes a switch transistor T, a resistor R1, a resistor R2, a resistor R3, a capacitor C43, a diode D1 and a diode D2, wherein the power supply end of switch transistor T is connected with an external control signal (such as a power supply) via resistor R1, and resistor R2 is connected with the output end of switch transistor T. The control end of switch transistor T is grounded via capacitor C43, and is also connected to the anode of diode D1, the cathode of diode D1 is connected to the anode of diode D2, and the cathode of diode D2 is grounded. The control end of switch transistor T is also connected with an external control signal via resistor R3. Switch transistor T may be a triode transistor or a field effect transistor.

The output stage amplifier circuits described in the present invention are turned on in different modes. According to the different signal frequencies received by the preamplifier circuit, one preamplifier circuit is selected to be turned on, and then switch S1 or switch S2 is turned on, thereby realizing the maximum output of the operating frequency. Two groups of preamplifiers are used to amplify signals in different frequency bands. When power-amplifier tube Q1 works, switch S1 is turned off and switch S2 is turned on. When power-amplifier tube Q2 works, switch S2 is turned off and switch S1 is turned on.

Figure 19:
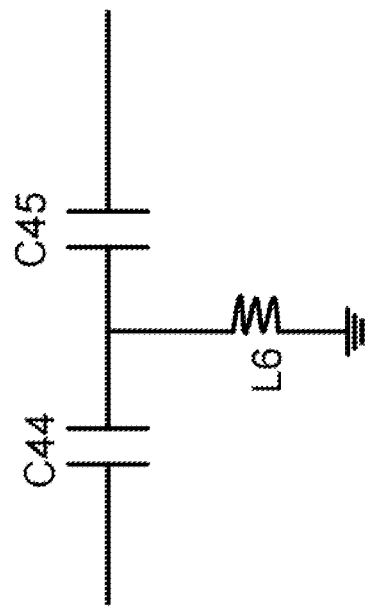
FIG. 19 is a schematic circuit diagram of the input matching circuit described in the present invention.
Figure 20:
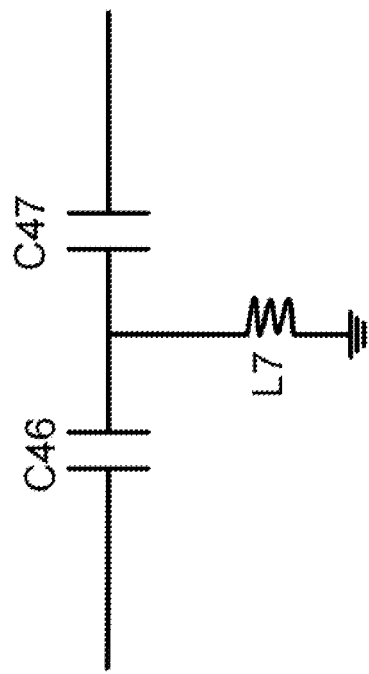
FIG. 20 is an another schematic circuit diagram of the input matching circuit described in the present invention.

In order to ensure the stability of the signal loaded on preamplifier circuit 1, the power amplifier further includes an input matching circuit 10 for filtering the signal to be amplified, and input matching circuit 10 is connected with the input end of preamplifier circuit 6. It may be any of the existing capacitance filter circuit, inductance filter circuit, RC filter circuit and LC filter circuit. As shown in FIGS. 19 and 20 respectively, the present application adopts an input matching circuit 10 composed of a capacitor C44, a capacitor C45, and an inductor L6, and connected to the input of a preamplifier circuit composed of power-amplifier tube Q1; and an input matching circuit 10 composed of a capacitor C46, a capacitor C47, and an inductor L7, and connected to the input of a preamplifier circuit composed of a power-amplifier tube Q4. The first plate of capacitor C44 and the first plate of capacitor C46 are used as input ends for loading signals, and the second plate of capacitor C44 and the second plate of capacitor C46 are connected to the control ends of power-amplifier tube Q1 and power-amplifier tube Q2 via capacitor C45 and capacitor C47 respectively. The second plate of capacitor C44 is further grounded via inductor L6, and the second plate of capacitor C46 is further grounded via inductor L7.

Figure 15:
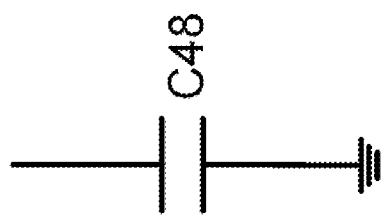
FIG. 15 is an example of the matching circuit described in the present invention.

Matching circuit 7 described in the present invention may be composed of a capacitive element, or a capacitive element and an inductive element, which may be anyone of the following circuits:

1) As shown in FIG. 15, it includes an independent capacitor C48, which is connected between the output end of preamplifier circuit 6 and ground.

Figure 16:
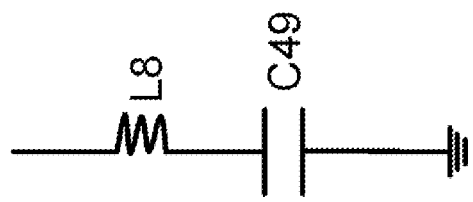
FIG. 16 is an another example of the matching circuit described in the present invention.

2) As shown in FIG. 16, it includes a capacitor C49 and an inductor L8, which are connected in series between the output end of preamplifier circuit 6 and ground.

Figure 17:
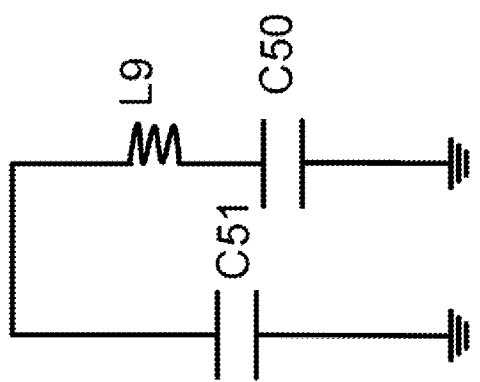
FIG. 17 is an another example of the matching circuit described in the present invention.

3) As shown in FIG. 17, it includes a capacitor C50, a capacitor C51 and an inductor L9, wherein capacitor C51 is connected between the output end of preamplifier circuit 8 and ground, and capacitor C50 and inductor L9 are connected in series between the output end of the preamplifier circuit and ground.

In order to make circuit power supply VCC1 stably loaded on the input end of input transformer T1, the end of switch S1 and/or switch S2 connected to circuit power supply VCC1 is further grounded via capacitor C1/capacitor C2; capacitor C1 and capacitor C2 are arranged beside circuit power supply VCC1, so it acts as a decoupling capacitor, which can not only provide a stable power supply, but also reduce the noise of components coupled to the input end of input transformer T1, thus reducing the influence of the noise of the input transformer on other components and ensuring the stability of the circuit.

The distribution modes of impedance transformation component 1, first matching component 2, second matching component 3, third matching component 4, selection component for frequency band subdivision 5, preamplifier circuit 6, matching circuit 7, input transformer T1, output stage amplifier circuit 8, switch S1, switch S2, input matching circuit 10 and bias circuit 9 described in this application can be one of the followings or others:

Premplifier circuit 6, matching circuit 7, input transformer T1, output stage amplifier circuit 8, input matching circuit 10 an bias circuit 9 can be integrated on one chip by HBT/SOI/CMOS/PHEMT/BIHEMT/SiGe or other processes to form a power amplifier chip. First matching component 2, second matching component 3, third matching component 4 and selection component for frequency band subdivision 5 are integrated on a chip by HBT/SOI/CMOS/PHEMT/BIHEMT/SiGe or other processes to form an independent switch chip A. Switch S1 and switch S2 are integrated on a chip by HBT/SOI/CMOS/PHEMT/BIHEMT/SiGe or other processes to form an independent switch chip B. Impedance transformation component 1 is set independently, which can be made into an independent chip by IPD process or integrated on a substrate. These chips are communicated with each other via wires.

2. First matching component 2, second matching component 3, preamplifier circuit 6, matching circuit 7, input transformer T1, output stage amplifier circuit 8, input matching circuit 10, bias circuit 9, switch S1 and switch S2 can be integrated on one chip by HBT/SOI/CMOS/PHEMT/BIHEMT/SiGe or other processes to form a power amplifier chip. Third matching component 4 and selection component for frequency band subdivision 5 are integrated on a chip by HBT/SOI/CMOS/PHEMT/BIHEMT/SiGe or other processes to form an independent switch chip. Impedance transformation component 1 is set independently, which can be made into an independent chip by IPD process or integrated on a substrate. These chips are communicated with each other via wires.

First matching component 2, second matching component 3, third matching component 4, or input matching circuit 10 in the above distribution modes 1 and 2 may be used as an independent component instead of being integrated in the chip.

In the present application, input transformer T1 and output transformer T2 may be any types of the existing transformers. A balanced-unbalanced transformer (Balun) is used in the present application. By using Balun and following the connection modes described in the present invention, a push-pull power amplifier is constructed.

The controllable switch of the power amplifier provided by the invention is a radio frequency switch, and is controlled by an external signal, so as to complete the reconstruction of each matching network in the input circuit and output matching circuit, thereby realizing the switching of operating frequency in one single amplifier, supporting the signal amplification in a wider frequency band, and solving the problems of large number of components, difficulty in integration and difficulty in design caused by setting multiple groups of power amplifiers for power amplification in different frequency bands in the prior art.

The above embodiments are only used to illustrate the technical solution of the present application, not intended to limit it. Modifications or equivalent substitutions made by those skilled in the art, which do not deviate from the spirit or scope of the present application, shall be included in the protection scope of the claims.

What is claimed is:

1. A power amplifier, comprising an input circuit and an output matching circuit, characterized in that:

the input circuit comprises at least two preamplifier circuits, a matching circuit for matching an output signal of each preamplifier circuit, an input transformer T1 comprising at least two output taps, an output stage amplifier circuit with the same number as the output taps of the input transformer T1, a switch S1 and a switch S2; and circuit power supply VCC1 is loaded on an input end of the input transformer T1 via the switch S1 and the switch S2 respectively; operating frequencies of the matching circuit are different; and the output matching circuit comprises an impedance transformation component, configured to transform impedance; and a first matching component, connected to an input end of the impedance transformation component to establish matching; the first matching component comprises an impedance element and a controllable switch element whose on/off is controlled by an external control signal to form different impedances.

2. The power amplifier of claim 1, further comprising a second matching circuit connected to the power input end of the impedance transformation component to establish matching to form different impedances.

3. The power amplifier of claim 2, wherein the second matching circuit is composed of an impedance element, or an impedance element and a controllable switch element whose on/off is controlled by an external control signal.

4. The power amplifier of claim 1, further comprising a third matching circuit connected to an output end of the impedance transformation component to establish matching to form different impedances.

5. The power amplifier of claim 4, wherein the third matching circuit is composed of an impedance element, or an impedance element and a controllable switch element whose on/off is controlled by an external control signal.

6. The power amplifier of claim 1, further comprising a selection component for frequency band subdivision connected to an output end of the impedance transformation component; and the selection component for frequency band subdivision comprises at least two independent controllable switch elements whose on/off is controlled by an external signal, and each controllable switch element constitutes one output.

7. The power amplifier of claim 4, further comprising a selection component for frequency band subdivision connected to an output end of the third matching component; and the selection component for frequency band subdivision comprises at least two independent controllable switch elements whose on/off is controlled by an external signal, and each controllable switch element constitutes one output.

8. The power amplifier of claim 1, wherein the matching circuit is composed of a capacitive element, or a capacitive element and an inductive element.

9. The power amplifier of claim 1, wherein the input circuit further comprises an input matching circuit for performing input matching on a signal loaded on an input end of each preamplifier circuit.

10. The power amplifier of claim 1, wherein one or more of the input circuit and the output matching circuit or other functional components are integrated on one chip, and the others are integrated on another chip or distributed independently.

* * * * *